United States Patent
Marksteiner

(10) Patent No.: US 10,491,189 B2
(45) Date of Patent: Nov. 26, 2019

(54) TOPOGRAPHICAL STRUCTURE AND METHOD OF PRODUCING IT

(71) Applicant: Snaptrack Inc., San Diego, CA (US)

(72) Inventor: Stephan Marksteiner, Neubiberg (DE)

(73) Assignee: QUALCOMM Incorporated, San Diego, CA (US)

( * ) Notice: Subject to any disclaimer, the term of this patent is extended or adjusted under 35 U.S.C. 154(b) by 48 days.

(21) Appl. No.: 14/413,285

(22) PCT Filed: Jul. 31, 2013

(86) PCT No.: PCT/EP2013/066115
§ 371 (c)(1),
(2) Date: Jan. 7, 2015

(87) PCT Pub. No.: WO2014/020077
PCT Pub. Date: Feb. 6, 2014

(65) Prior Publication Data
US 2015/0171822 A1  Jun. 18, 2015

(30) Foreign Application Priority Data

Aug. 3, 2012 (DE) .................. 10 2012 107 155

(51) Int. Cl.
*H03H 9/17* (2006.01)
*H01L 41/08* (2006.01)
(Continued)

(52) U.S. Cl.
CPC ............. *H03H 9/171* (2013.01); *C23C 16/44* (2013.01); *C23C 16/45525* (2013.01);
(Continued)

(58) Field of Classification Search
CPC ..................... H03H 9/171; H03H 3/02; H01L 41/047–0478
(Continued)

(56) References Cited

U.S. PATENT DOCUMENTS 5,081,559 A * 1/1992 Fazan .................... H01L 28/55
257/306
5,335,138 A * 8/1994 Sandhu ............. H01L 27/10808
257/306
(Continued)

FOREIGN PATENT DOCUMENTS

DE         10045090        3/2002
DE        102004053318     5/2006
(Continued)

OTHER PUBLICATIONS

Notification of Reasons for Rejection of dated Jan. 19, 2016 of corresponding Japanese Application No. 2015-524779, along with an English translation.
(Continued)

*Primary Examiner* — Dean O Takaoka
*Assistant Examiner* — Alan Wong
(74) *Attorney, Agent, or Firm* — Patterson & Sheridan, L.L.P.

(57) ABSTRACT

A topographical structure includes a carrier layer (TS); at least one metal layer (M) applied on the carrier layer; a marginal topology edge at the metal layer; and a structured cover (AB) at the topology edge.

10 Claims, 4 Drawing Sheets

(51) Int. Cl.
*H03H 3/02* (2006.01)
*H01L 41/316* (2013.01)
*H03H 9/02* (2006.01)
*C23C 16/44* (2006.01)
*C23C 16/455* (2006.01)
*C23C 16/50* (2006.01)
*C23F 1/00* (2006.01)
*H01L 41/047* (2006.01)
*H03H 9/19* (2006.01)
*H03H 9/25* (2006.01)

(52) U.S. Cl.
CPC ............... *C23C 16/50* (2013.01); *C23F 1/00* (2013.01); *H01L 41/047* (2013.01); *H01L 41/0805* (2013.01); *H01L 41/316* (2013.01); *H03H 3/02* (2013.01); *H03H 9/02133* (2013.01); *H03H 9/19* (2013.01); *H03H 9/25* (2013.01)

(58) Field of Classification Search
USPC ................................................ 333/187–192
See application file for complete search history.

(56) References Cited

U.S. PATENT DOCUMENTS

| | | | | |
|---|---|---|---|---|
| 5,656,852 | A | 8/1997 | Nishioka et al. | |
| 6,698,073 | B2 * | 3/2004 | Dekker | H03H 3/02 156/152 |
| 6,924,583 | B2 * | 8/2005 | Lin | H03H 3/04 310/312 |
| 6,924,717 | B2 * | 8/2005 | Ginsburg | H03H 9/132 310/312 |
| 6,954,121 | B2 * | 10/2005 | Bradley | H03H 3/04 333/133 |
| 7,059,711 | B2 * | 6/2006 | Aoto | B41J 2/14233 347/70 |
| 7,129,806 | B2 * | 10/2006 | Sato | H03H 3/02 333/187 |
| 7,187,253 | B2 * | 3/2007 | Sano | H03H 3/02 29/25.35 |
| 7,358,831 | B2 * | 4/2008 | Larson, III | H03H 9/02102 333/187 |
| 7,482,737 | B2 * | 1/2009 | Yamada | H03H 3/02 310/363 |
| 7,657,983 | B2 * | 2/2010 | Aigner | H03H 3/02 216/38 |
| 7,768,364 | B2 * | 8/2010 | Hart | H03H 9/02149 310/364 |
| 7,843,113 | B2 * | 11/2010 | Wijngaards | B41J 2/14233 310/320 |
| 2007/0080611 | A1 | 4/2007 | Yamada et al. | |
| 2007/0247260 | A1 * | 10/2007 | Yanase | H03H 3/02 333/187 |

FOREIGN PATENT DOCUMENTS

| | | |
|---|---|---|
| JP | 2005536908 A | 12/2005 |
| JP | 2007-110281 | 4/2007 |
| WO | 03/058811 | 7/2003 |
| WO | 2007/119643 | 10/2007 |

OTHER PUBLICATIONS

International Search Report and Written Opinion—PCT/EP2013/066115—ISA/EPO—dated Oct. 22, 2013.

* cited by examiner

TOPOGRAPHICAL STRUCTURE AND METHOD OF PRODUCING IT

TECHNICAL FIELD

This disclosure relates to topographical structures suitable for BAW electrodes and production methods thereof.

BACKGROUND

Frequency filters produced using thin-film technology, for example, BAW filters (bulk acoustic wave filters) or specific SAW filters (surface acoustic wave filters), find application as a frequency-determining component in transmitters and receivers which operate in the frequency range of several hundred MHz to approximately 20 GHz. Such filters are used in radio-frequency technology, for example, in mobile radio and WLAN.

SAW filters and BAW filters are passive filters having usually a bandpass filter characteristic wherein an acoustic wave is generated from an electrical signal and, vice versa, with the aid of the piezo-effect. In a SAW filter, the acoustic wave propagates at the surface of the piezo-substrate, while the acoustic waves propagate through the piezo-substrate in the BAW filter.

On account of their particularly advantageous electrical and physical properties, BAW filters are increasingly replacing SAW filters in radio-frequency technology. BAW filters are available for pass frequencies of approximately 1 GHz to 20 GHz, have a lower insertion loss (0.5 dB) than SAW filters and achieve a quality factor of more than 1000. At the same time, BAW filters can be realized in smaller structural sizes and are generally more cost-effective to produce.

During production of BAW resonators using thin-film technology, the piezo-electric thin-film layer, for example, an aluminum nitride, zinc oxide or PZT layer is deposited on a carrier using reactive sputtering deposition. The quality of the piezo-layer crucially influences the technical properties of the BAW resonator. A crystalline and highly oriented piezo-layer is particularly advantageous and places stringent demands on the deposition method and the deposition conditions such as, for example, pressure, temperature, homogeneity of the substrate and purity of the media.

The piezo-layer is usually grown heteroepitaxially above a metal and carrier layer in BAW manufacture. This form of layer growth leads to a columnar, polycrystalline piezo-layer. One disadvantage of that type of layer growth is that growth defects in the crystal microstructure occur along topology edges on the carrier layer. Such growth defects have consequences for the technical properties and reliability of the BAW resonators.

The problem is explained below by way of example with reference to FIG. 1. FIG. 1 shows, with the aid of a micrograph recorded by a scanning electron microscope, an excerpt from a BAW resonator in cross section during production. A multilayer electrode comprising a lower first, corrosion-sensitive metal layer (M1) and an upper second metal layer (M2) is arranged on a carrier layer (TS) composed of silicon dioxide. The transition from the upper metal layer to the lower metal layer is characterized by a flat topology edge, and the transition from the lower metal layer to the carrier layer is characterized by a steep topology edge. A piezo-layer (PS) is deposited above the metal layers and the carrier layer. During the growth of the piezo-layer, the flat topology edge at the transition from the upper metal layer to the lower metal layer has led to a slight disturbance in the crystal microstructure (imperfection A). The imperfection A is characterized by disturbed grain growth. This is a slight disturbance since the two piezo-layer regions on the left and right of the imperfection are in good contact. The steep topology edge at the transition from the lower metal layer to the carrier layer has led to the formation of a great disturbance in the crystal microstructure (imperfection B), which results in a gap or even cavity extending through the entire piezo-layer. Along such growth defects such as are evident from FIG. 1, liquids can penetrate during subsequent wet-chemical processes and corrode corrosion-sensitive metal layers. This occurs, in particular, if aluminum, titanium, titanium nitride, silver or copper or multilayer systems comprising these materials are used as metal layer material.

Corrosion of the metal layers leads to poor electrical properties of the BAW resonators and constitutes a quality risk that is difficult to calculate with regard to the reliability of these components. A further problem is that during the subsequent deposition of a metallic upper layer for the counterelectrode on the piezo-layer, a metallic extension can form in the cavity and, in the worst case, leads to a short circuit in the electrode.

To improve the technical properties and avoid corrosion in the bottom electrode of BAW resonators, it is known that the bottom electrode can be embedded into a dielectric with the aid of CMP processes (U.S. Pat. No. 7,657,983). This method is very complex in terms of process engineering, however, since the dielectric deposited over the whole area has to be removed from the surface of the electrode by chemical mechanical polishing to yield a planar surface comprising electrode and dielectric, on which planar surface the piezo-layer can grow.

It is also known to smooth steep topology edges by chemically etching the metal layers. For aluminum, in particular, no reproducible etching processes that lead to oblique sidewalls exist here, however.

A further alternative is to avoid corrosion-sensitive constituents in the bottom electrode. However, non-corrosion-sensitive metals generally have a poor conductivity. This necessitates very thick electrode layers and is therefore suitable only for specific designs of BAW resonators. A likewise unsatisfactory solution is to avoid corrosive processes during the manufacture of BAW resonators, which necessitates new process steps and yields uncertain results.

It could therefore be helpful to provide a structure suitable for BAW electrodes, for example, together with a production method with which the problems that occur during layer growth can be avoided and, in particular, susceptibility of the lower metal layers or electrodes to corrosion can be reduced.

SUMMARY

I provide a topographical structure including a carrier layer (TS); at least one metal layer (M) applied on the carrier layer; a marginal topology edge at the metal layer; and a structured cover (AB) at the topology edge.

I further provide a method of producing a topographical structure including applying one or a plurality of metal layers to a carrier layer with thin-film technology, subsequently depositing over the whole area an edge-covering protective layer (SS) over the carrier layer and the metal layers; and anisotropically etching back the protective layer to an extent until planar regions of the carrier layer and of the metal layer are freed of the protective layer and from the protective layer the structured cover is maintained at marginal topology edges of the metal layer.

BRIEF DESCRIPTION OF THE DRAWINGS

The topographical structure is described in detail below with reference to FIGS. 2, 3 and 4. The description serves the purpose of explanation and not limitation to specific details. Moreover, the features illustrated for the purpose of explanation in FIGS. 2, 3 and 4 are not necessarily reproduced true to scale.

DETAILED DESCRIPTION

Figure 1:
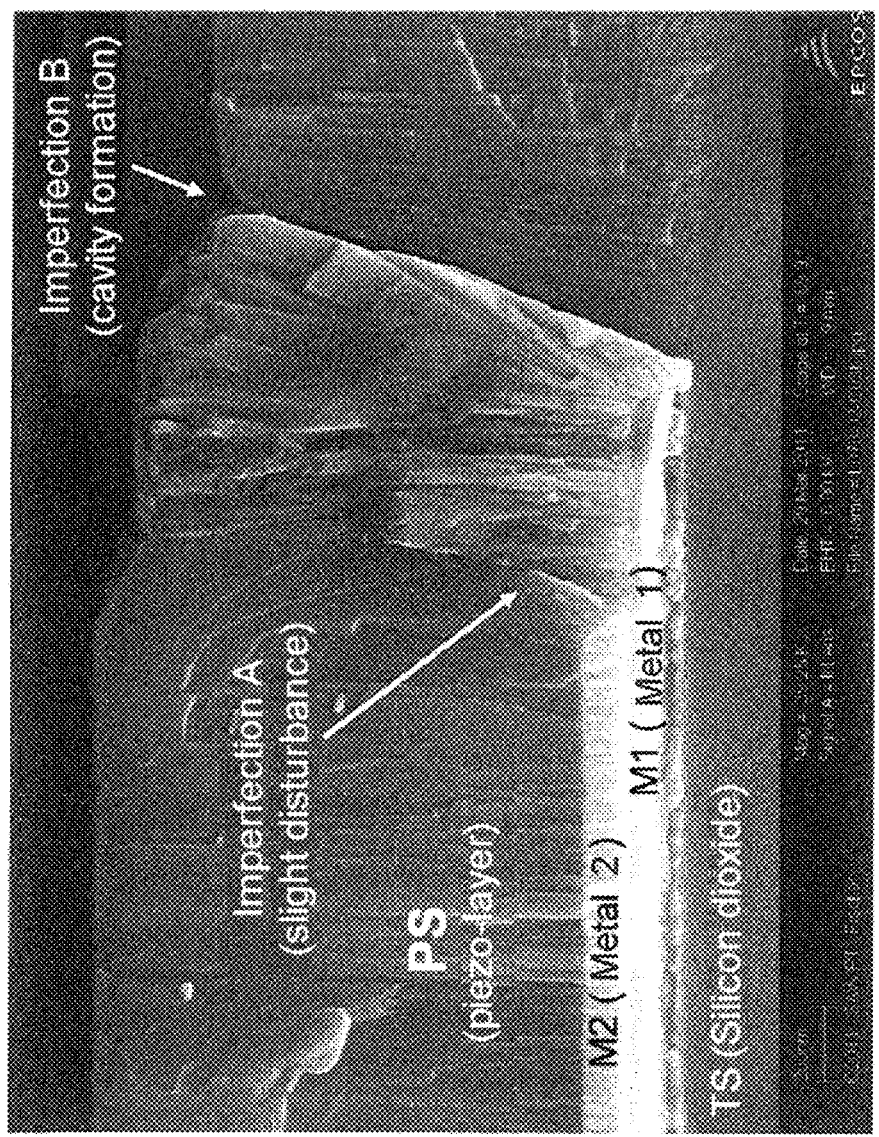
FIG. 1 shows, in a micrograph recorded by a scanning electron microscope, an excerpt from a BAW resonator in cross section during production in the intermediate step after the deposition of the piezo-layer.

When mention is made hereinafter of a carrier layer, a metal layer, a marginal topology edge of a metal layer or a structured cover of a topology edge, that does not preclude the fact that a larger number of these details can also be present. The same also applies to other numerical values, unless an exactly specified number is explicitly discussed. In the description, moreover, relative terms such as, for example, on, at the top, at the very top, under, at the bottom, above and below are used to describe in a simple way the relationship between the different elements such as are illustrated in the figures. Other relative orientations such as would result from the rotation of the illustrated elements by 90° or 180°, for example, can readily be derived from the description and are expressly included.

The topographical structures comprise a carrier layer, to which at least one structured metal layer is applied using thin-film technology. Topographical structures of this type are, for example, electrodes or multilayer electrodes produced using thin-film technology. The side margins of the metal layer form a topology edge in the transition to the carrier layer. A structured cover is arranged along this marginal topology edge. The structured cover brings about edge smoothing. The inclination angle of the structured cover with respect to the carrier then changes continuously with increasing distance from the topology edge and is generally also more obtuse than the angle between the metal layer and the carrier layer.

In one configuration, exactly one structured metal layer is applied on the carrier layer. The designation "metal layer" is defined here as a collective term for all metallizations distinguished by a layer thickness above the carrier, which need not necessarily have a planar surface. Therefore, a metal layer can also consist of a plurality of non-continuous coatings on the carrier layer which comprise one or a plurality of metals.

In a further configuration, a plurality of metal layers arranged one above another, for example, a so-called "metal sandwich", are applied on the carrier layer. Such a metal sandwich is used, for example, in mirror-based BAW resonators (also called SMR="surface mounted resonator").

In specific examples comprising metal layers arranged one above another, provision is also made for the side margins of an upper metal layer, for example, to form an additional topology edge in the transition to a lower metal layer arranged underneath. In specific examples, such an additional topology edge can be present in an offset fashion relative to the topology edge which is present between the side margins of the structured metal layer in the transition to the carrier layer. This can be the case, for example, if an upper metal layer covers a smaller area than a lower metal layer. Such configurations can be present, for example, as a result of undercutting or overetching effects or multiple lithographic steps to structure the metal layers. I provide for the structured cover also to be arranged along this additional topology edge. I furthermore provide that in specific examples, moreover, further additional topology edges with structured cover can also be present, for example, if more than two metal layers arranged one above another are applied on the carrier layer.

Two or more metal layers may be arranged one above another, of which the lower metal layer or one of the lower metal layers is corrosion-sensitive. One or more of the overlying metal layers are not corrosion-sensitive or are less corrosion-sensitive than the lower metal layer(s).

The metal layer at the very top need not be corrosion-sensitive or may be less corrosion-sensitive than the underlying metal layers. The topographical structure may comprise exactly two metal layers, of which the lower, first metal layer is corrosion-sensitive and the upper, second metal layer is not corrosion-sensitive or is less corrosion-sensitive than the first layer. In this example, the function of the structured edge cover encompasses anticorrosion protection. For this purpose, the edge cover consists of a passivating material that is sufficiently impermeable in particular relative to corrosive substances.

In this way, the topographical structure is protected against corrosion better than for known comparable structures. This opens up improved possibilities for wet-chemical etches and cleaning processes. An improved reproducibility and reliability of the components is likewise achieved.

The metal layers of the topographical structure can be layers comprising aluminum, titanium, titanium nitride, silver, copper, tungsten, tantalum, molybdenum, platinum, rubidium or gold, for example. A corrosion-sensitive metal layer can be, for example, a layer comprising aluminum, titanium, titanium nitride, silver or copper. Advantageously, one of the metal layers is composed of aluminum. Good electrical conduction and simple layer production are thus ensured. With the edge cover, the Al layer as lower layer is also sufficiently stable against corrosion. The upper metal layer, which is not corrosion-sensitive or is only corrosion-sensitive to a small extent, can be a layer comprising tungsten, tantalum, molybdenum, platinum or gold. Layers comprising tungsten and molybdenum are advantageous.

In a further configuration, a crystal layer is deposited or grown onto the topographical structure. The crystal layer can be a non-epitaxially grown layer, for example. I found that on the topographical structure the crystal layer grows with less pronounced growth disturbances than for comparable structures. This advantageous effect can be explained by the fact that the structured cover at the topology edge results in a closed enclosure of the corrosion-sensitive metal between the non-corrosion-sensitive or less corrosion-sensitive upper metal layer and the carrier layer. In this way, corrosive substances cannot advance via imperfections in the crystal microstructure as far as the corrosion-sensitive metal layer.

The crystal layer may be a piezo-layer. The piezo-layer can be an aluminum nitride layer, a zinc oxide layer or a lead zirconate titanate layer, for example. Furthermore, the piezo-layer can comprise lithium niobate or lithium tantalate.

The topographical structure may be part of a BAW resonator. In this example, the metal layer applied on the carrier layer or the metal layers applied on the carrier layer forms or form the bottom electrode of the BAW resonator. The corresponding top electrode is deposited on the piezo-layer.

It is possible with the topographical structure to arrange a plurality of BAW resonators one above another. These so-called "stacked" BAW resonators have a plurality of piezo-layers arranged between electrodes. For this form of example, the marginal topology edge of each metal layer onto which a piezo-layer is deposited is provided with a structured cover at the topology edge of the metal layer. In this way, it is possible to realize BAW resonators having a multiplicity of piezo-layers, the electrodes of which are protected against corrosion.

Figure 2:
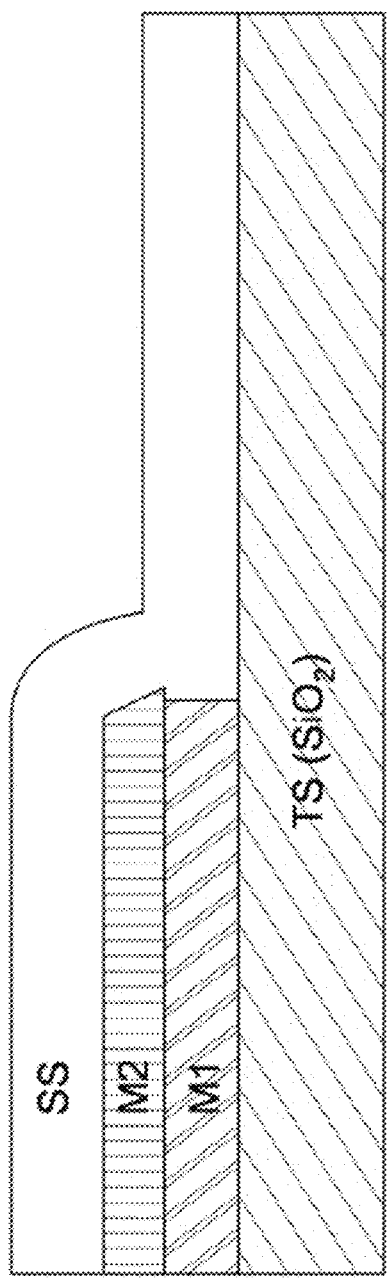
FIG. 2 shows a schematic example of a topographical structure in cross section during production after the whole-area and edge-covering deposition of the protective layer above the metal layers and the carrier layer.

FIG. 2 shows an intermediate product of the method of producing my topographical structures. Using thin-film technology a first metal layer (M1) is applied to a carrier layer (TS) comprising at least one upper layer composed of silicon oxide and is structured, a topology edge to the carrier layer being formed. This first, lower metal layer is one of two metal layers of a multilayered bottom electrode of a BAW resonator. Metal layer M1 is preferably composed of aluminum, silver or copper or an alloy comprising aluminum, silver or copper. A second metal layer (M2) is applied on the first, lower metal layer. The metal layer M2 can terminate marginally flush with the metal layer M1, but can also be structured such that metal layer M1 is not completely covered by metal layer M2. The metal layer M2 is preferably a layer comprising tungsten, tantalum, molybdenum, platinum, rubidium or gold. A tungsten layer is particularly preferred.

Furthermore, on this structure a protective layer (SS) is deposited over the whole area and in an edge-covering manner above the carrier layer and the metal layers. Any material which is not corrosion-sensitive and which is anisotropically etchable sufficiently selectively with respect to the topmost metal layer of the bottom electrode can be used for the protective layer. The protective layer is preferably a layer of silicon oxide, silicon nitride or polyimide. A layer of silicon oxide is particularly preferred. The protective layer can be deposited by chemical vapor deposition, plasma-enhanced chemical vapor deposition, atomic layer deposition or variants of these coating methods. Atomic layer deposition is particularly advantageous.

The thickness of the protective layer is limited only by the homogeneity of the deposition and the subsequent etching process. A layer thickness of at least one to two times the thickness of the metal layers is preferred, however. In this case, the coating method produces an edge-covering protective layer having, at the marginal topology edge of the metal layers, a layer thickness which in the normal to the carrier layer is larger than in the planar regions of the topographical structure.

The topographical structure shown in FIG. 2 is subsequently subjected to an anisotropic etching process. In this case, the protective layer is etched back anisotropically to an extent until the planar regions of the carrier layer and of the metal layer are freed of the protective layer and from the protective layer the structured cover (AB) is maintained at the marginal topology edges of the metal layer on account of the higher layer thickness of the protective layer present here.

The anisotropic etching back of the protective layer is accomplished by physical, chemical or physico-chemical dry etching methods. Chemical dry etching methods are advantageous, for example, plasma etching or ion beam etching (ion milling). Plasma etching is particularly advantageous. Advantageously, but not necessarily, use is made of an etching method which has a selectivity with respect to the upper metal layer M2 and possibly also with respect to the carrier layer TS (for example $SiO_2$).

Figure 3:
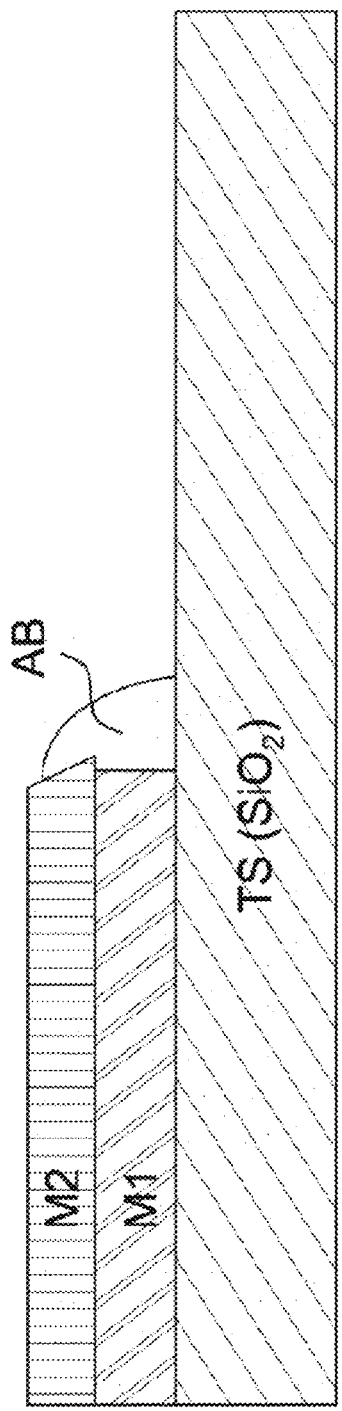
FIG. 3 shows a schematic example of a topographical structure in cross section during production after the anisotropic etching back of the protective layer.

FIG. 3 shows the topographical structure after the etching back of the protective layer. By virtue of the anisotropic etching back, the structured cover (AB) at the marginal topology edge of the metal layers M1 and M2 results from the protective layer. The planar surfaces of the topographical structure, for example, the second upper metal layer M2 and the carrier layer TS, are freed of the protective layer to the greatest possible extent or completely. The topology edge of the first lower metal layer is completely covered by the structured cover AB.

In the example in accordance with FIG. 3, the above-described anisotropic etching back of the protective layer was carried out until the protective layer SS was completely removed from the planar surface of the top metal surface. Alternatively, the anisotropic etching back can be chosen such that in comparison more or less material from the protective layer is maintained as structured edge cover AB and, for example, the structured edge cover extends as far as the planar surface of the upper metal layer.

The piezoelectric layer is subsequently grown. Preferably, the piezo-layer is deposited by reactive sputtering, for example, from an ultrapure aluminum target in a nitrogen atmosphere with formation of AlN. Epitaxy methods, chemical vapor deposition (CVD) or atomic layer deposition (ALD) or combinations of these methods are alternatively provided.

Figure 4:
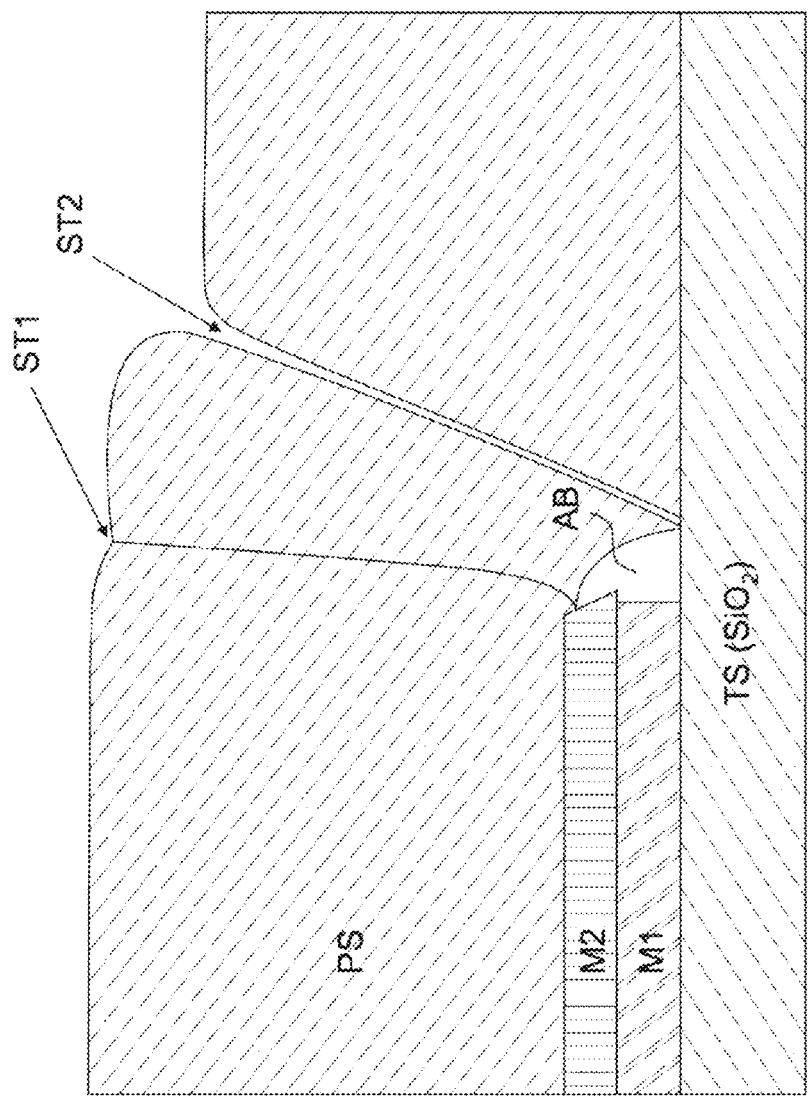
FIG. 4 shows a schematic example of a topographical structure in cross section during production after the growth of the piezo-layer.

FIG. 4 shows the topographical structure after growth of the piezoelectric layer (PS). A homogeneous crystal microstructure of the piezo-layer PS arises above the planar regions of the metal electrode M1, M2. At the transition from the upper metal layer to the structured edge cover, the soft topology edge leads to a slight disturbance of the crystal microstructure wherein the crystal layers on both sides of the imperfection ST1 are in good contact. In the region of the steep topology edge that characterizes the transition from the structured cover to the carrier layer, it is still possible, as illustrated, for the formation of a great imperfection ST2 in the crystal microstructure to occur, which is accompanied by channel and cavity formation. On account of the structured edge cover, however, the disturbance in the crystal microstructure does not extend as far as the metal layer M1. The surprising result is that a corrosion channel to the corrosion-sensitive metal M1 cannot form at either of the two imperfections.

The invention claimed is:

1. A bulk acoustic wave (BAW) resonator, comprising:
a carrier layer;
at least one metal layer applied on the carrier layer and having a marginal topology edge extending between an uppermost surface of the at least one metal layer and a surface of the carrier layer adjacent a lowermost surface of the at least one metal layer;
a structured cover at the marginal topology edge and having an outer surface with an inclination angle relative to the carrier layer that changes continuously over the entire outer surface with increasing distance from the marginal topology edge and is more obtuse than an angle between the at least one metal layer and the carrier layer, wherein the structured cover comprises polyimide; and a layer of a piezoelectric material applied on the uppermost surface of the at least one metal layer and on the outer surface of the structured cover.

2. The BAW resonator according to claim 1, wherein the at least one metal layer comprises a first metal layer and a second metal layer applied on the first metal layer.

3. The BAW resonator according to claim 2, wherein the first metal layer is corrosion-sensitive.

4. The BAW resonator according to claim 3, wherein the first metal layer comprises aluminum, titanium nitride, silver or copper.

5. The BAW resonator according to claim 3, wherein the second metal layer is not corrosion-sensitive or is less corrosion-sensitive than the first metal layer.

6. The BAW resonator according to claim 5, wherein the second metal layer comprises tungsten, tantalum, molybdenum, platinum or gold.

7. The BAW resonator according to claim 2, wherein the structured cover at the marginal topology edge and the second metal layer cover surfaces of the first metal layer, other than the lowermost surface of the at least one metal layer.

8. The BAW resonator according to claim 1, wherein the at least one metal layer comprises an electrode or a multilayer electrode produced using thin-film technology.

9. The BAW resonator according to claim 1, wherein the structured cover at the marginal topology edge is less corrosion-sensitive than a portion of the at least one metal layer.

10. The BAW resonator according to claim 1, wherein the piezoelectric material comprises lithium niobate or lithium tantalate.

* * * * *